United States Patent
Underwood et al.

(10) Patent No.: US 10,460,936 B2
(45) Date of Patent: Oct. 29, 2019

(54) PHOTO-ASSISTED DEPOSITION OF FLOWABLE FILMS

(71) Applicant: Applied Materials, Inc., Santa Clara, CA (US)

(72) Inventors: Brian Saxton Underwood, Campbell, CA (US); Abhijit Basu Mallick, Fremont, CA (US); Mukund Srinivasan, Fremont, CA (US); Juan Carlos Rocha-Alvarez, San Carlos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/784,834

(22) Filed: Oct. 16, 2017

(65) Prior Publication Data
US 2018/0040473 A1     Feb. 8, 2018

Related U.S. Application Data

(63) Continuation of application No. 14/580,621, filed on Dec. 23, 2014, now abandoned.
(Continued)

(51) Int. Cl.
*H01L 21/02*    (2006.01)
*H01J 11/36*    (2012.01)
(Continued)

(52) U.S. Cl.
CPC ........ *H01L 21/0262* (2013.01); *C23C 16/401* (2013.01); *C23C 16/482* (2013.01);
(Continued)

(58) Field of Classification Search
CPC ..... C23C 16/56; C23C 16/482; C23C 16/401; C23C 16/48; H01L 21/02532;
(Continued)

(56) References Cited

U.S. PATENT DOCUMENTS 6,178,920 B1    1/2001  Ye et al.
8,043,434 B2 *  10/2011  Chebi ............... G03F 7/427
                                                134/1
(Continued)

FOREIGN PATENT DOCUMENTS

WO    2007002040 A2    1/2007

OTHER PUBLICATIONS

International Search Report and Written Opinion dated Apr. 17, 2015 for Application No. PCT/US2014/072065.

*Primary Examiner* — Evren Seven
(74) *Attorney, Agent, or Firm* — Patterson + Sheridan LLP

(57) ABSTRACT

A method and apparatus for forming a flowable film are described. The method includes providing an oxygen free precursor gas mixture to a processing chamber containing a substrate. The oxygen free precursor gas is activated by exposure to UV radiation in the processing chamber. Molecular fragments resulting from the UV activation are encouraged to deposit on the substrate to form a flowable film on the substrate. The substrate may be cooled to encourage deposition. The film may be hardened by heating and/or by further exposure to UV radiation.

19 Claims, 2 Drawing Sheets

Related U.S. Application Data

(60) Provisional application No. 61/920,785, filed on Dec. 26, 2013.

(51) Int. Cl.
    *C23C 16/54*           (2006.01)
    *H01L 21/324*        (2006.01)
    *C23C 16/40*           (2006.01)
    *C23C 16/48*           (2006.01)
    *C23C 16/56*           (2006.01)

(52) U.S. Cl.
    CPC .............. *C23C 16/54* (2013.01); *C23C 16/56* (2013.01); *H01J 11/36* (2013.01); *H01L 21/02529* (2013.01); *H01L 21/02532* (2013.01); *H01L 21/02658* (2013.01); *H01L 21/02664* (2013.01); *H01L 21/324* (2013.01)

(58) Field of Classification Search
    CPC ........... H01L 21/02658; H01L 21/0262; H01L 21/324; H01L 21/02664; H01L 21/02529; H01L 21/02
See application file for complete search history.

(56) References Cited

U.S. PATENT DOCUMENTS

| | | | |
|---|---|---|---|
| 8,216,861 B1 | 7/2012 | Yim et al. | |
| 8,449,679 B2* | 5/2013 | Dhindsa | H01J 37/32642 118/723 E |
| 8,753,474 B2* | 6/2014 | Nangoy | H01J 37/321 118/715 |
| 2001/0017257 A1 | 8/2001 | Choi et al. | |
| 2004/0033674 A1 | 2/2004 | Todd | |
| 2004/0175501 A1 | 9/2004 | Lukas et al. | |
| 2005/0255714 A1* | 11/2005 | Iyer | C23C 16/345 438/793 |
| 2006/0286775 A1* | 12/2006 | Singh | C23C 16/0227 438/478 |
| 2006/0286776 A1* | 12/2006 | Ranish | C23C 16/0227 438/478 |
| 2008/0078744 A1* | 4/2008 | Wang | H01J 37/00 216/67 |
| 2010/0055926 A1 | 3/2010 | Ohashi et al. | |
| 2011/0151678 A1 | 6/2011 | Ashtiani et al. | |
| 2012/0258259 A1* | 10/2012 | Bansal | C23C 16/0272 427/558 |
| 2013/0230987 A1 | 9/2013 | Draeger et al. | |
| 2014/0356984 A1* | 12/2014 | Ventzek | H01L 21/2236 438/7 |

\* cited by examiner

PHOTO-ASSISTED DEPOSITION OF FLOWABLE FILMS

CROSS-REFERENCE TO RELATED APPLICATIONS

This is a continuation of U.S. patent application Ser. No. 14/580,621 filed, Dec. 23, 2014, which claims benefit of U.S. Provisional Patent Application Ser. No. 61/920,785 filed, Dec. 26, 2013, each of which is incorporated herein by reference.

FIELD

Embodiments described herein relate to processes and apparatus for depositing flowable films on a substrate. More specifically, embodiments described herein relate to processes and apparatus for forming oxygen free flowable films.

BACKGROUND

Flowable films are widely used in the semiconductor industry. A film is deposited on a substrate in a way that the material forming the film flows to fill trenches and grooves formed in the substrate, resulting in a smooth surface. Plasma processes exist for forming silicon oxide flowable films, but such films are prone to etching under fluorine chemistries. There is a need in the industry for methods and apparatus for forming flowable semiconductor films that are substantially oxygen free.

SUMMARY

Embodiments described herein provide a method for forming a flowable film. The method includes providing an oxygen free precursor gas mixture to a processing chamber containing a substrate. The oxygen free precursor gas is activated by exposure to UV radiation in the processing chamber. Molecular fragments resulting from the UV activation are encouraged to deposit on the substrate to form a flowable film on the substrate. The substrate may be cooled to encourage deposition. The film may be hardened by heating and/or by further exposure to UV radiation.

DETAILED DESCRIPTION

Figure 1:
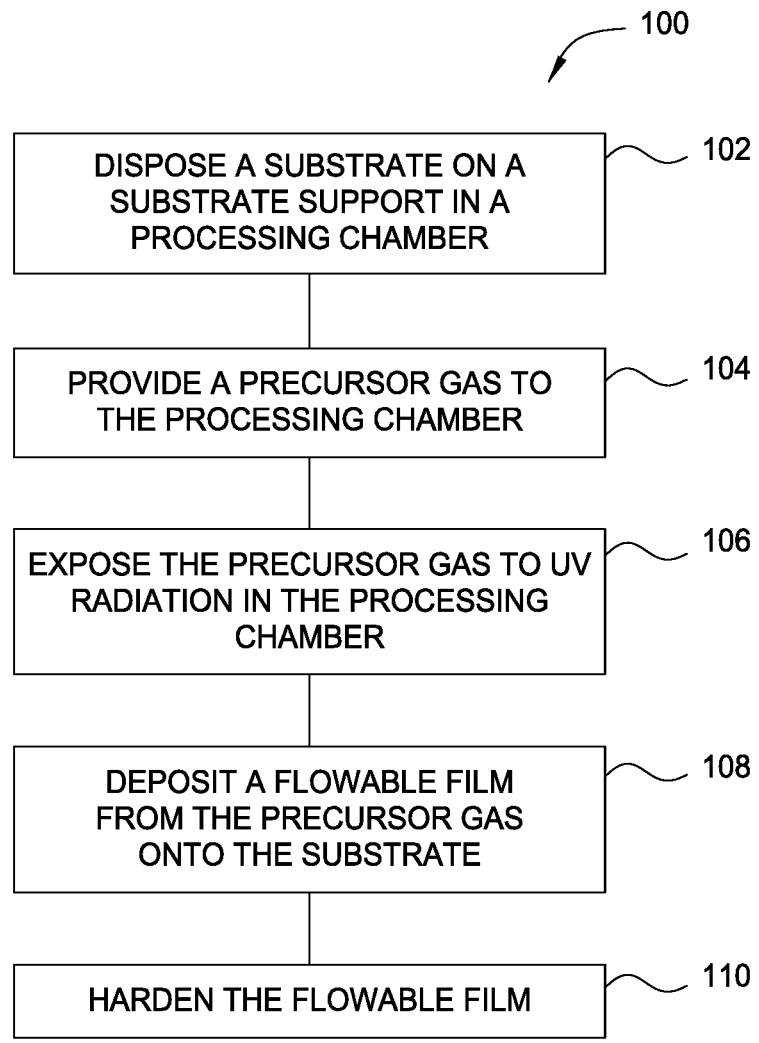
FIG. 1 is a flow diagram summarizing a method according to one embodiment.

Applicants have discovered a process for forming a flowable film from UV-activated precursors. FIG. 1 is a flow diagram summarizing a method 100 according to one embodiment. A substrate is disposed on a substrate support in a processing chamber at 100. At 102, a precursor gas is provided to the chamber to interact with the substrate. The precursor gas generally contains a material to be converted into a film on the substrate.

At 104, the precursor gas is exposed to UV radiation in the process chamber. The UV radiation may have energy that activates species in the precursor gas to a reactive, or more reactive, state. The UV radiation may ionize species of the precursor gas, or the UV radiation may have energy less than an ionization potential of the precursor gas. The UV radiation may be generated using a lamp, an LED, or a laser. If necessary, the radiation may be optically transformed in any convenient way to facilitate activating the precursor gas.

At 106, a flowable film is deposited on the substrate surface. Upon activation, species of the precursor gas may form intermediate species near the substrate surface. The intermediate species may be oligomers that, when deposited on the substrate surface, form the flowable layer. The substrate may be maintained at a temperature that encourages the intermediates to deposit, for example by condensing, on the substrate surface. Some of the intermediates, after depositing on the substrate surface, may further react with species in the precursor gas to progress formation of the flowable layer. The intermediates may also react with each other on the substrate surface. Typically, a substrate is maintained at a temperature less than about 50° C. As the intermediate species in the vapor phase near the substrate surface encounter the reduced temperature of the substrate and near the substrate surface, they combine on or near the substrate surface and deposit on the substrate surface as a flowable film, which may be a liquid.

At 108, the flowable film is hardened. The flowable film may be exposed to UV radiation to promote continued reaction of species in the flowable film. Smaller species react to form larger species that exhibit more properties of a solid. Residual hydrogen may be removed from the film as it hardens.

Precursors that may be used to form a flowable film include oxygen free precursors. Examples include silanes such as silane, disilane, trisilane, n-tetrasilane, isotetrasilane, neotetrasilane, cyclotetrasilane, cyclopentasilane, and cyclohexasilane; polysilanes; cyclopolysilanes; aminosilanes such as trisilylamine; organosilanes; carbosilanes such as disilylmethane and bis-silylmethylsilane; n-substituted silicon containing pyrrols such as N-silyl pyrrols and N-sila pyrrols; silicon containing hydrazones; and silicon containing azides. For depositing flowable silicon carbide, a silicon containing pyrazoline such as 2,4-disila-1-pyrazoline may be used as a precursor. Films of silicon, silicon-nitrogen, silicon-carbon, and silicon-carbon-nitrogen of varying compositions may be formed in this way.

The wavelength of activating radiation may be selected to activate particular energy modes within a precursor molecule. In some cases, the precursor gas may be decomposed by the activating radiation by breaking bonds to form smaller molecules, radicals and/or ions, or electrons may be removed to form ions. In the example of a polysilane, such as tetrasilane, the Si—Si bonds have energy of approximately 2.25 eV and the Si—H bonds have energy of approximately 3.25 eV. A photon having energy between about 2.25 eV and 3.25 eV may be expected to activate or break Si—Si bonds while having little effect on Si—H bonds. Such energies correspond approximately to wavelengths of 380 nm to 550 nm. Photons of wavelength shorter than 380 nm would be expected to activate or break Si—H bonds. Use of photons having wavelength shorter than 380 nm may be expected to activate or break both types of bonds. In the case of tetrasilane, silyl, disilyl, and trisilyl radicals are formed in the vapor phase near the substrate surface, polymerizing into oligosilanes that deposit on the substrate surface.

In the case of using silanes as precursors as described above, some hydrogen may be removed in the vapor phase, but some hydrogen remains in the deposited flowable film. During the hardening of 108 described above, three processes are thought to occur in the flowable film. The deposited silyl fragments are thought to polymerize further due to the reactivity of radical species. The UV radiation continues cleaving Si—Si bonds in the film, but most fragments created in this way are too large to volatilize. Si—H bonds may also be cleaved by the UV radiation. During the hardening of 108, the substrate temperature may be elevated to encourage hydrogen to volatilize and leave the film. A temperature is typically selected that encourages hydrogen to volatilize without substantially volatilizing film fragments, such as the silyl fragments referred to above. Any dangling bonds left by evacuating hydrogen are encouraged to link in the remaining matrix by the UV radiation. In this way, the film is hardened and the hydrogen content of the film is reduced, resulting in a film with resistance to oxidation.

The general process described above may be used to form flowable, oxygen free films having silicon, carbon, germanium, and nitrogen in virtually any proportions selectable by controlling the elemental composition of the precursor gas. Multiple wavelengths of UV radiation may be used, if desired, to overcome any mismatch between wavelength and absorption cross-section of components in the precursor gas. For example, if an elemental composition of 20% Ge, 50% Si, and 30% C is desired, a precursor mixture of organosilanes, carbosilanes, organogermanes, and carbogermanes may be used. If a single wavelength of UV radiation does not activate bonds in proportions that yield the desired film composition, a second wavelength may be selected based on absorption cross-section to favor activation of particular species in the precursor gas to tune the composition of the deposited film. Additionally, it may be possible to tune the composition of the precursor film to include more of one species or another to adjust the film composition. For example, pure hydrides of silicon, germanium, carbon, and nitrogen can be added to the precursor gas to influence the amount of silicon, germanium, carbon, and nitrogen in the film.

Deposition rate of the flowable film may be controlled by adjusting pressure in the processing chamber. Lower pressures generally yield lower deposition rates, which may result in higher quality films. Uniformity may be enhanced in some embodiments by rotating the substrate during the deposition and/or curing. In some embodiments, the UV radiation may be pulsed. It is thought that pulsing may be beneficial in some embodiments to improve the quality of the flowable film, and the resulting hardened flowable film. Pulsing the UV radiation may allow weaking bonded or deposited species to volatilize periodically, allowing larger, more reactive fragments to deposit instead.

Figure 2:
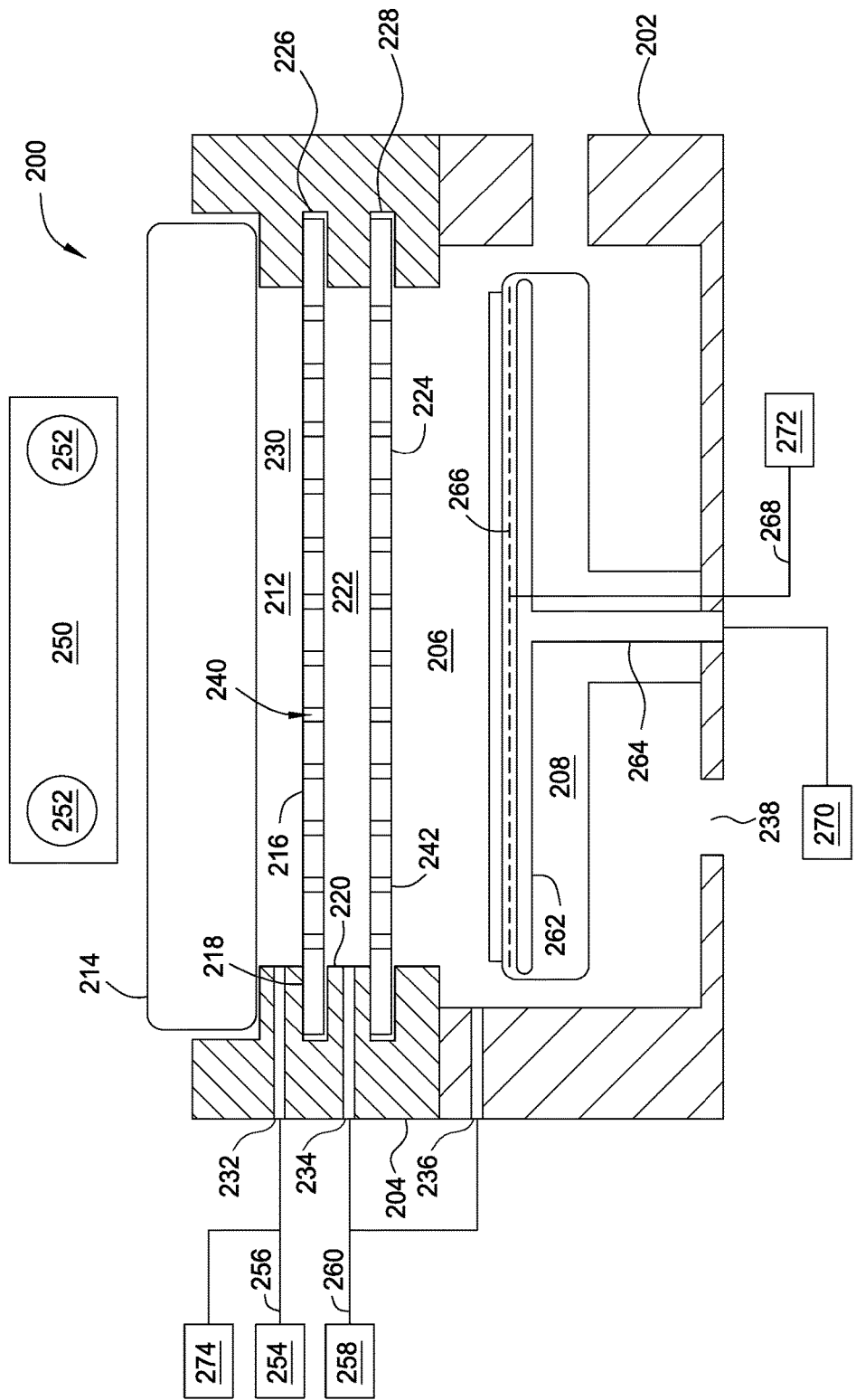
FIG. 2 is a schematic cross-sectional view of an apparatus according to another embodiment.

The methods described herein may be performed using the ONYX™ processing chamber available from Applied Materials, Inc., of Santa Clara, Calif. Formation of a flowable oxygen free film having silicon, carbon, germanium, and/or nitrogen may also be performed using an apparatus such as that shown in FIG. 2. The apparatus of FIG. 2 is a vapor deposition apparatus 200 that includes UV radiation for activating a precursor gas. The apparatus 200 includes a chamber body 202 and a chamber lid 204 disposed over the chamber body. The chamber body 202 and the chamber lid 204 form an inner volume 206. A substrate support assembly 208 is disposed in the inner volume 206. The substrate support assembly 208 receives and supports a substrate 210 thereon for processing.

A first UV transparent gas distribution showerhead 216 is hung in the inner volume 206 through a central opening 212 of the chamber lid 204 by an upper clamping member 218 and a lower clamping member 220. The UV transparent gas distribution showerhead 216 is positioned facing the substrate support assembly 208 to distribute one or more processing gases across a distribution volume 222 which is below the first UV transparent gas distribution showerhead 216. A second UV transparent showerhead 224 is hung in the inner volume 206 through the central opening 212 of the chamber lid 204 below the first UV transparent gas distribution showerhead 216. Each of the UV transparent gas distribution showerheads 216 and 224 is disposed in a recess formed in the chamber lid 204. A first recess 226 is an annular recess around an internal surface of the chamber lid 204, and the first UV transparent gas distribution showerhead 216 fits into the first recess 226. Likewise, a second recess 228 receives the second UV transparent gas distribution showerhead 224.

A UV transparent window 214 is disposed above the first UV transparent gas distribution showerhead 216. The window UV transparent 214 is positioned above the first UV transparent gas distribution showerhead 216 forming a gas volume 230 between the UV transparent window 214 and the first UV transparent gas distribution showerhead 216. The UV transparent window 214 may be secured to the chamber lid 204 by any convenient means, such as clamps, screws, or bolts.

The UV transparent window 214 and the first and second UV transparent gas distribution showerheads 216 and 224 are at least partially transparent to thermal or radiant energy within the UV wavelengths. The UV transparent window 214 may be quartz or another UV transparent silicon material, such as sapphire, $CaF_2$, $MgF_2$, AlON, a silicon oxide or silicon oxynitride material, or another transparent material.

A UV source 250 is disposed above the UV transparent window 214. The UV source 250 is configured to generate UV energy and project the UV energy towards the substrate support 208 through the UV transparent window 214, the first UV transparent gas distribution showerhead 216, and the second UV transparent gas distribution showerhead 224. A cover (not shown) may be disposed above the UV source 250. In one embodiment, the cover may be shaped to assist projection of the UV energy from the UV source 250 towards the substrate support.

In one embodiment, the UV source 250 includes one or more UV lights 252 to generate UV radiation. The UV lights may be lamps, LED emitters, or other UV emitters. More detailed descriptions of suitable UV sources can be found in U.S. Pat. No. 7,777,198, and United States Patent Publication 2006/0249175. The UV sources may be argon lamps discharging radiation at 126 nm, krypton lamps discharging at 146 nm, xenon lamps discharging at 172 nm, krypton chloride lamps discharging at 222 nm, xenon chloride lamps discharging at 308 nm, mercury lamps discharging at 254 nm or 365 nm, metal vapor lamps such as zinc, which discharges at 214 nm, rare earth near-UV lamps such as europium-doped strontium borate or fluoroborate lamps discharging at 368-371 nm, to name a few examples.

The apparatus 200 includes flow channels configured to supply one or more processing gases across the substrate support 208 to process a substrate disposed thereon. A first flow channel 232 provides a flow pathway for gas to enter the gas volume 230 and to be exposed to UV radiation from the UV source 250. The gas from the gas volume 230 may flow through the first UV transparent gas distribution showerhead 216 into the distribution volume 222. A second flow channel 234 provides a flow pathway for gas to enter the distribution volume 222 directly without passing through the first UV transparent gas distribution showerhead 216 to mix with the gas that was previously exposed to UV radiation in the gas volume 230. The mixed gases in the distribution volume 222 are further exposed to UV radiation through the first UV transparent gas distribution showerhead 216 before flowing through the second UV transparent gas distribution showerhead 224 into a space proximate the substrate support 208. The gas proximate the substrate support 208, and a substrate disposed on the substrate support 208, is further exposed to the UV radiation through the second UV transparent gas distribution showerhead 224. Gases may be exhausted through the opening 238. Purge gases may be provided through the opening 238 in the bottom of the chamber, such that the purge gases flow around the substrate support 208, effectively preventing intrusion of process gases into the space under the substrate support.

The first UV transparent gas distribution showerhead 216 includes a plurality of through holes 240 that allow processing gas to flow from the gas volume 230 to the distribution volume 222. The second UV transparent gas distribution showerhead 224 also includes a plurality of through holes 242 that allow processing gas to flow from the distribution volume 222 into the processing space proximate the substrate support 208. The through holes in the first and second gas UV transparent gas distribution showerheads may be evenly distributed with the same spacing or different spacing.

A purge gas source 254 may be coupled to the flow passage 232 through a conduit 256. Purge gas from the purge gas source 254 may be provided through the flow passage 232 during substrate processing to prevent intrusion of process gases into the gas volume 230. A cleaning gas source 274 may also be coupled to the flow passage 232 through the conduit 256 to provide cleaning of the conduit 256, the flow passage 232, the gas volume 230, and the rest of the chamber 202 when not processing substrates.

A process gas source 258 may be coupled to the flow passage 234 through a conduit 260 to provide a process gas mixture, as described above, to the chamber 202. The process gas source 258 may also be coupled to the flow passage 236. Appropriate valving may allow selection of one or both of the flow passages 234/236 for flowing the process gas mixture into the chamber 202.

Substrate temperature may be controlled by providing heating and cooling features in the substrate support 208. A coolant conduit 264 may be coupled to a coolant source 270 to provide a coolant to a cooling plenum 262 disposed in the substrate support 208. One example of a coolant that may be used is a mixture of 50% ethylene glycol in water, by volume. The coolant flow is controlled to maintain temperature of the substrate at or below a desired level to promote deposition of UV-activated oligomers or fragments on the substrate. A heating element 266 may also be provided in the substrate support 208. The heating element 266 may be a resistive heater, and may be coupled to a heating source 272, such as a power supply, by a conduit 268. The heating element 266 may be used to heat the substrate during the hardening process described above.

While the foregoing is directed to embodiments of the present invention, other and further embodiments of the invention may be devised without departing from the basic scope thereof, and the scope thereof is determined by the claims that follow.

The invention claimed is:

1. A processing chamber, comprising:
a chamber lid;
a UV transparent window disposed in the chamber lid;
a chamber body defining a processing space, the processing space containing a substrate support;
a first UV transparent divider having a plurality of openings;
a gas volume formed between the UV transparent window and the first UV transparent divider, the gas volume fluidly coupled to a first flow channel through which at least one first gas enters the processing chamber;
a distribution volume separated from the gas volume by the first UV transparent divider, the distribution volume being fluidly coupled to a second flow channel through which at least one second gas enters the distribution volume; and
a source of UV radiation directed towards the gas volume, the UV transparent window disposed directly between the source of UV radiation and the gas volume.

2. The processing chamber of claim 1, wherein the first UV transparent divider is a showerhead.

3. The processing chamber of claim 1, further comprising: a second divider having a plurality of openings and separating the distribution volume from the gas volume and the processing space, the distribution volume being defined by the first UV transparent divider and the second divider.

4. The processing chamber of claim 3, wherein the second divider is transparent to UV radiation.

5. The processing chamber of claim 4, wherein the source of UV radiation is directed through the first UV transparent divider and the second divider towards the distribution volume.

6. The processing chamber of claim 3, wherein the second divider is a showerhead.

7. The processing chamber of claim 1, wherein the substrate support comprises heating and cooling features.

8. The processing chamber of claim 7, wherein the heating and cooling features comprise at least one of: a coolant conduit, a heating element, and a resistive heater.

9. The processing chamber of claim 1, wherein the substrate support is configured to rotate during processing.

10. The processing chamber of claim 1, wherein the source of UV radiation is at least one of a lamp, a LED, and a laser.

11. The processing chamber of claim 1, wherein the source of UV radiation is configured to pulse during processing.

12. The processing chamber of claim 1, further comprising a pressure regulator for the processing space.

13. The processing chamber of claim 1, further comprising a UV transparent window between the source of UV radiation and the gas volume.

14. The processing chamber of claim 13, wherein the UV transparent window comprises at least one of: quartz, a UV transparent silicon material, sapphire, CaF2, MgF2, AlON, a silicon oxide material, and a silicon oxynitride material.

15. A method of processing a substrate, comprising:
disposing the substrate in a processing space defined in a chamber body of a processing chamber;
providing, via a first flow channel, a first precursor gas to a gas volume of the processing chamber, first flow channel being fluidly coupled to the gas volume, the gas volume being formed between a UV transparent window disposed in a lid of the processing chamber and at least one UV transparent divider, the at least one UV transparent divider having a plurality of openings formed therethrough;
activating the first precursor gas by exposing the first precursor gas to UV radiation in the gas volume of the chamber, the UV transparent window being disposed directly between a source of the UV radiation and the gas volume;

flowing the activated first precursor gas to the processing space through the at least one UV transparent divider, wherein the gas volume is defined by the lid of the processing chamber and the at least one UV transparent divider;

providing, via a second flow channel, a second precursor gas to a distribution volume of the processing chamber, the distribution volume being adjacent to the gas volume and separated from the gas volume by the at least one UV transparent divider, the second flow channel being fluidly coupled to the distribution volume; and forming an oxygen free flowable film on the substrate from the activated first precursor gas.

16. The method of claim 15, further comprising:

flowing the second precursor gas to the processing space through a second divider, the second divider having a plurality of openings formed therein; wherein the distribution volume is positioned between the processing space and the gas volume and is formed between the at least one UV transparent divider and the second divider, and the distribution volume is separated from the processing space by the second divider.

17. The method of claim 15, wherein the activating the first precursor gas comprises:

reacting the first precursor gas to form oligomers in a gas phase, and condensing the oligomers on the substrate.

18. A method of processing a substrate, comprising:

disposing the substrate in a processing space defined in a chamber body of a processing chamber;

providing, via a first flow channel, a first precursor gas to a gas volume of the processing chamber, the first flow channel being fluidly coupled to the gas volume, the gas volume being formed between a UV transparent window disposed in a lid of the processing chamber and at least one UV transparent divider, wherein the gas volume is separated from the processing space by the at least one UV transparent divider, the at least one UV transparent divider having a plurality of openings;

decomposing the first precursor gas by exposing the first precursor gas to UV radiation in the gas volume of the chamber, the UV transparent window being disposed directly between a source of the UV radiation and the gas volume;

flowing the decomposed first precursor gas to the processing space through the at least one UV transparent divider;

providing, via a second flow channel, a second precursor gas to a distribution volume of the chamber, the second flow channel being fluidly coupled to the distribution volume; and forming an oxygen free flowable film on the substrate from the decomposed first precursor gas and the second precursor gas.

19. The method of claim 18, wherein:

the first precursor gas is oxygen free;

the first precursor gas comprises at least one of: a silane, an aminosilane, an organosilane, a carbosilane, an n-substituted silicon containing pyrrol, a silicon containing hydrazone, a silicon containing azide, a silicon containing pyrazoline, a tetrasilane, an N-silyl pyrrol, an N-sila pyrrol, and 2,4-disila-1-pyrazoline; and wherein forming the oxygen free flowable film on the substrate from the decomposed first precursor gas and the second precursor gas comprises forming oligomers in a gas phase, and condensing the oligomers on the substrate.

* * * * *